US012077643B2

(12) United States Patent
He et al.

(10) Patent No.: US 12,077,643 B2
(45) Date of Patent: Sep. 3, 2024

(54) NON-POLAR ETHYLENE-BASED COMPOSITIONS WITH TRIALLYL PHOSPHATE FOR ENCAPSULANT FILMS

(71) Applicant: Dow Global Technologies LLC, Midland, MI (US)

(72) Inventors: Chao He, Shanghai (CN); Bharat I. Chaudhary, Collegeville, PA (US); Brian M. Habersberger, Lake Jackson, TX (US); Hong Yang, Shanghai (CN); Weiming Ma, Shanghai (CN); Yuyan Li, Beijing (CN)

(73) Assignee: Dow Global Technologies LLC, Midland, MI (US)

( * ) Notice: Subject to any disclaimer, the term of this patent is extended or adjusted under 35 U.S.C. 154(b) by 2 days.

(21) Appl. No.: 17/958,911

(22) Filed: Oct. 3, 2022

(65) Prior Publication Data
US 2023/0047706 A1    Feb. 16, 2023

Related U.S. Application Data

(63) Continuation of application No. 16/617,978, filed as application No. PCT/CN2017/086553 on May 31, 2017, now abandoned.

(51) Int. Cl.
| | | |
|---|---|---|
| C08J 5/18 | (2006.01) | |
| C08F 210/16 | (2006.01) | |
| C08K 5/14 | (2006.01) | |
| C08K 5/3492 | (2006.01) | |
| C08K 5/521 | (2006.01) | |
| C08K 5/5425 | (2006.01) | |
| H01L 31/048 | (2014.01) | |

(52) U.S. Cl.
CPC ............. *C08J 5/18* (2013.01); *C08F 210/16* (2013.01); *C08K 5/14* (2013.01); *C08K 5/34924* (2013.01); *C08K 5/521* (2013.01); *C08K 5/5425* (2013.01); *H01L 31/0481* (2013.01); *C08F 2810/20* (2013.01); *C08J 2323/08* (2013.01); *C08K 2201/014* (2013.01)

(58) Field of Classification Search
CPC .................................................... H01L 31/048
See application file for complete search history.

(56) References Cited

U.S. PATENT DOCUMENTS

| | | | |
|---|---|---|---|
| 3,974,132 A | 8/1976 | Valdiserri | |
| 6,147,180 A * | 11/2000 | Markel | ............... C08L 23/0815 |
| | | | 526/348 |
| 6,579,584 B1 | 6/2003 | Compton | |

(Continued)

FOREIGN PATENT DOCUMENTS

| | | |
|---|---|---|
| CN | 103289582 A | 9/2013 |
| CN | 104263285 A | 1/2015 |

(Continued)

OTHER PUBLICATIONS

"Dow Engage 8100" Specification Sheet (Year: 2011).

*Primary Examiner* — Sadie White
(74) *Attorney, Agent, or Firm* — Boyle Frederickson SC

(57) ABSTRACT

An encapsulant film is made from a composition comprising (A) a non-polar ethylene-based polymer having a density of 0.850 g/cc to 0.890 g/cc; (B) an organic peroxide; (C) a silane coupling agent; and (D) a co-agent comprising triallyl phosphate.

13 Claims, 1 Drawing Sheet

(56) References Cited

U.S. PATENT DOCUMENTS

| | | | |
|---|---|---|---|
| 7,858,705 B2 | 12/2010 | Parent et al. | |
| 9,837,569 B2 | 12/2017 | Rasal et al. | |
| 2005/0051204 A1 | 3/2005 | Oi et al. | |
| 2007/0149710 A1 | 6/2007 | Chaudhary et al. | |
| 2009/0023826 A1 | 1/2009 | Nishimura et al. | |
| 2010/0069538 A1* | 3/2010 | Kempe | C08K 5/22 524/502 |
| 2011/0303263 A1* | 12/2011 | Corfias-Zuccalli | C09D 123/0884 524/517 |
| 2012/0088868 A1* | 4/2012 | Worku | C08L 23/12 524/130 |
| 2012/0097220 A1 | 4/2012 | Miyashita et al. | |
| 2012/0279559 A1* | 11/2012 | Stollwerck | H01L 31/049 438/73 |
| 2013/0102734 A1* | 4/2013 | Takaragi | H01L 31/0203 526/282 |
| 2013/0137833 A1* | 5/2013 | Amamiya | C08K 5/14 525/333.7 |
| 2015/0013753 A1* | 1/2015 | Nanjundiah | B32B 17/10018 136/251 |
| 2015/0129018 A1 | 5/2015 | Declerck et al. | |
| 2015/0171247 A1* | 6/2015 | Maruko | H01L 31/0481 136/259 |
| 2016/0024427 A1 | 1/2016 | Sivik et al. | |
| 2016/0141436 A1 | 5/2016 | Rasal et al. | |
| 2017/0117426 A1 | 4/2017 | Jacques et al. | |
| 2017/0317222 A1* | 11/2017 | Murofushi | H01L 31/049 |

FOREIGN PATENT DOCUMENTS

| | | |
|---|---|---|
| CN | 106684186 A | 5/2017 |
| EP | 2562821 A1 | 2/2013 |
| KR | 20070021087 A | 2/2007 |
| WO | 2010/017553 A1 | 2/2010 |
| WO | 2010/017554 A1 | 2/2010 |

\* cited by examiner

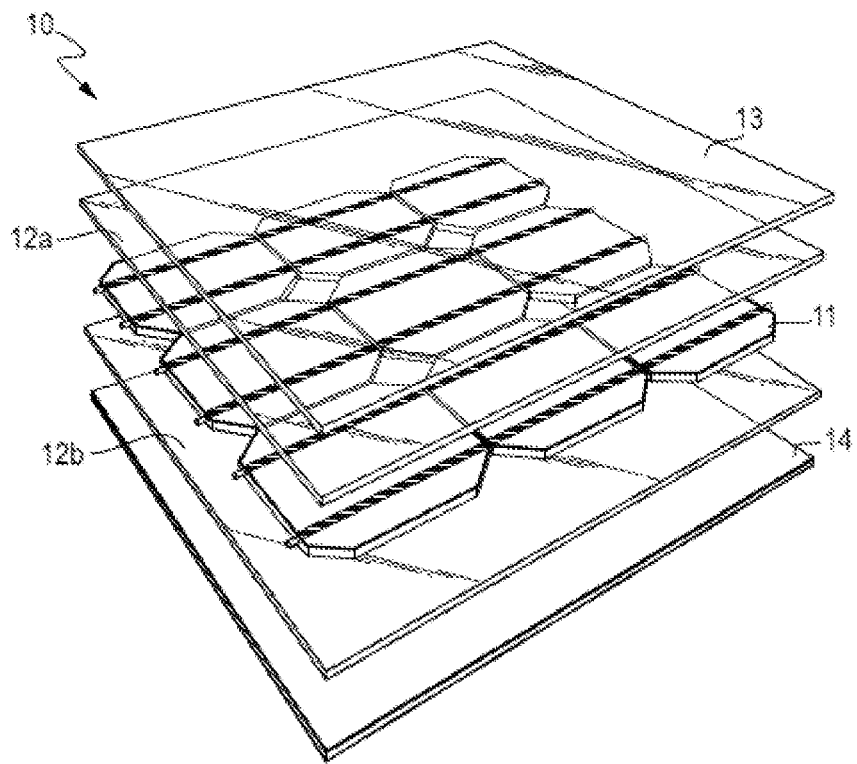

NON-POLAR ETHYLENE-BASED COMPOSITIONS WITH TRIALLYL PHOSPHATE FOR ENCAPSULANT FILMS

FIELD OF THE DISCLOSURE

This disclosure relates to non-polar ethylene-based polymer compositions for encapsulant films. In one aspect, the disclosure relates to non-polar ethylene-based polymer compositions having high volume resistivity, while in another aspect, the disclosure relates to encapsulant films comprising a non-polar ethylene-based polymer composition and electronic devices including the same.

BACKGROUND

The global demand for alternative energy has resulted in large increases in solar panel and photovoltaic (PV) module production over the last decade. The solar cells (also called PV cells) that convert solar energy into electrical energy are extremely fragile and must be surrounded by a durable encapsulant film. Two main functions of the encapsulant film are to (1) bond the solar cell to the glass coversheet and the backsheet and (2) protect the PV module from environmental stress (e.g., moisture, temperature, shock, vibration, electrical isolation, etc.).

In order to be used as an encapsulant film, a film must show (a) good lamination performance, (b) strong adhesion with glass, the PV cell, and the backsheet, (c) good electrical insulation (low leakage current, high volume resistivity), (d) good optical transparency, (e) low water vapor permeability and moisture absorption, (f) good creep resistance, (g) stability in UV exposure, and (h) good weathering. Current encapsulant films are primarily made of ethylene vinyl acetate (EVA) because EVA shows a good balance of (a)-(h). EVA is a type of ethylene/unsaturated carboxylic ester copolymer in which the unsaturated carboxylic ester comonomer is a vinyl carboxylate. Because EVA is so readily used to form encapsulant films, numerous additive packages have been developed to enhance one or more of (a)-(h).

Non-polar polyolefins, such as ethylene-based elastomers that are not ethylene/unsaturated carboxylic ester copolymers, have been used to make encapsulant films, yet require organic peroxide and a coupling agent, generally a silane coupling agent, in order to adhere to glass sufficiently. A crosslinking co-agent is typically used with the non-polar polyolefin-based encapsulant films in order to obtain sufficient glass adhesion. However, many conventional crosslinking agents are problematic because they reduce the volume resistivity of the encapsulant film. Consequently, the art recognizes the need for crosslinking co-agents that provide sufficient glass adhesion and improve volume resistivity for encapsulant films.

SUMMARY

The disclosure provides an encapsulant film. The encapsulant film comprises a composition, the composition comprising (A) a non-polar ethylene-based polymer having a density of 0.850 g/cc to 0.890 g/cc; (B) an organic peroxide; (C) a silane coupling agent; and (D) a co-agent comprising triallyl phosphate.

In another embodiment, the disclosure provides an electronic device module. The electronic device module comprises an electronic device and at least one film composed of a crosslinked polymeric composition which is the reaction product of a composition comprising (A) a non-polar ethylene-based polymer having a density of 0.850 g/cc to 0.890 g/cc; (B) an organic peroxide; (C) a silane coupling agent; and (D) a co-agent comprising triallyl phosphate.

BRIEF DESCRIPTION OF THE DRAWINGS

FIG. 1 is an exploded perspective view of an exemplary photovoltaic module.

DEFINITIONS AND TEST METHODS

Any reference to the Periodic Table of Elements is that as published by CRC Press, Inc., 1990-1991. Reference to a group of elements in this table is by the new notation for numbering groups.

For purposes of United States patent practice, the contents of any referenced patent, patent application or publication are incorporated by reference in their entirety (or its equivalent US version is so incorporated by reference) especially with respect to the disclosure of definitions (to the extent not inconsistent with any definitions specifically provided in this disclosure) and general knowledge in the art.

The numerical ranges disclosed herein include all values from, and including, the lower and upper value. For ranges containing explicit values (e.g., 1 or 2, or 3 to 5, or 6, or 7), any subrange between any two explicit values is included (e.g., 1 to 2; 2 to 6; 5 to 7; 3 to 7; 5 to 6; etc.).

Unless stated to the contrary, implicit from the context, or customary in the art, all parts and percents are based on weight and all test methods are current as of the filing date of this disclosure.

Unless stated to the contrary, all test methods are current as of the filing date of this disclosure.

"Blend", "polymer blend" and like terms mean a composition of two or more polymers. Such a blend may or may not be miscible. Such a blend may or may not be phase separated. Such a blend may or may not contain one or more domain configurations, as determined from transmission electron spectroscopy, light scattering, x-ray scattering, and any other method used to measure and/or identify domain configurations. Blends are not laminates, but one or more layers of a laminate may contain a blend.

"Composition," as used herein, includes a mixture of materials which comprise the composition, as well as reaction products and decomposition products formed from the materials of the composition.

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step or procedure, excepting those that are not essential to operability. The term "consisting of" excludes any component, step or procedure not specifically listed. The term "or," unless stated otherwise, refers to the listed members individual as well as in any combination. Use of the singular includes use of the plural and vice versa.

Crosslinking or cure is tested using a moving die rheometer. The moving die rheometer (MDR) is loaded with 5 grams of each sample. The MDR is run for 25 minutes and the time v. torque curve is provided for the samples over the given interval. The MDR is run at 130° C. and 150° C. The 130° C. represents the maximum film fabrication temperature. The 150° C. represents the module lamination temperature. The maximum torque (MH) exerted by the MDR during the 25 minute testing interval is reported in dNm. The MH usually corresponds to the torque exerted at 25 minutes. The time it takes for the torque to reach X % of MH ($t_x$) is reported in minutes. $t_x$ is a standardized measurement to understand the curing kinetics of each resin. The time to reach 90% of MH ($T_{90}$) is reported in minutes.

Density is measured in accordance with ASTM D792. The result is recorded in grams (g) per cubic centimeter (g/cc or g/cm$^3$).

"Directly contacts" refers to a layer configuration whereby a first layer is located immediately adjacent to a second layer and no intervening layers or no intervening structures are present between the first layer and the second layer.

An "ethylene-based polymer" is a polymer that contains more than 50 weight percent polymerized ethylene monomer (based on the total amount of polymerizable monomers) and, optionally, may contain at least one comonomer. Ethylene-based polymer includes ethylene homopolymer, and ethylene copolymer (meaning units derived from ethylene and one or more comonomers). The terms "ethylene-based polymer" and "polyethylene" may be used interchangeably. Non-limiting examples of ethylene-based polymer (polyethylene) include low density polyethylene (LDPE) and linear polyethylene. Non-limiting examples of linear polyethylene include linear low density polyethylene (LLDPE), ultra low density polyethylene (ULDPE), very low density polyethylene (VLDPE), multi-component ethylene-based copolymer (EPE), ethylene/α-olefin multi-block copolymers (also known as olefin block copolymer (OBC)), single-site catalyzed linear low density polyethylene (m-LLDPE), substantially linear, or linear, plastomers/elastomers, medium density polyethylene (MDPE), and high density polyethylene (HDPE). Generally, polyethylene may be produced in gas-phase, fluidized bed reactors, liquid phase slurry process reactors, or liquid phase solution process reactors, using a heterogeneous catalyst system, such as Ziegler-Natta catalyst, a homogeneous catalyst system, comprising Group 4 transition metals and ligand structures such as metallocene, non-metallocene metal-centered, heteroaryl, heterovalent aryloxyether, phosphinimine, and others. Combinations of heterogeneous and/or homogeneous catalysts also may be used in either single reactor or dual reactor configurations.

Glass adhesion strength (maximum glass adhesion strength and average glass adhesion strength from 1" to 2") is measured by the 180° peel test. Cuts are made through the backsheet and film layers of each of the laminated samples (e.g., comparative example and inventive example formulations) to divide each laminated sample into three 1-inch wide strip specimens, with the strips still adhered to the glass layer. The 180° peel test is conducted on an Instron TM 5565 under controlled ambient conditions. The initial glass adhesion is tested and the results are reported in Newtons/cm. Three specimens are tested to get the average glass adhesion strength for each sample.

Glass transition temperature (Tg) is measured according to ASTM D7028.

"Interpolymer," as used herein, refers to polymers prepared by the polymerization of at least two different types of monomers. The generic term interpolymer thus includes copolymers (employed to refer to polymers prepared from two different types of monomers), and polymers prepared from more than two different types of monomers.

Melt index (MI) is measured in accordance with ASTM D1238 at 190° C., 2.16 kg and reported in grams per 10 minutes (g/10 min).

Melting point is measured according to ASTM D3418.

"Non-polar ethylene-based polymer" and like terms refer to an ethylene-based polymer that does not have a permanent dipole, i.e., the polymer does not have a positive end and a negative end, and is void of heteroatoms and functional groups. "Functional group" and like terms refer to a moiety or group of atoms responsible for giving a particular compound its characteristic reactions. Non-limiting examples of functional groups include heteroatom-containing moieties, oxygen-containing moieties (e.g., alcohol, aldehyde, ester, ether, ketone, and peroxide groups), and nitrogen-containing moieties (e.g., amide, amine, azo, imide, imine, nitratie, nitrile, and nitrite groups). A "heteroatom" is an atom other than carbon or hydrogen, as defined above.

"Photovoltaic cell", "PV cell" and like terms mean a structure that contains one or more photovoltaic effect materials of any of several inorganic or organic types which are known in the art and from prior art photovoltaic module teachings. For example, commonly used photovoltaic effect materials include one or more of the known photovoltaic effect materials including but not limited to crystalline silicon, polycrystalline silicon, amorphous silicon, copper indium gallium (di)selenide (CIGS), copper indium selenide (CIS), cadmium telluride, gallium arsenide, dye-sensitized materials, and organic solar cell materials. As shown in FIG. 1, PV cells are typically employed in a laminate structure and have at least one light-reactive surface that converts the incident light into electric current. Photovoltaic cells are well known to practitioners in this field and are generally packaged into photovoltaic modules that protect the cell(s) and permit their usage in their various application environments, typically in outdoor applications. PV cells may be flexible or rigid in nature and include the photovoltaic effect materials and any protective coating surface materials that are applied in their production as well as appropriate wiring and electronic driving circuitry.

"Photovoltaic module", "PV module" and like terms refer to a structure including a PV cell. A PV module may also include a cover sheet, front encapsulant film, rear encapsulant film and backsheet, with the PV cell sandwiched between the front encapsulant film and rear encapsulant film.

"Polymer," as used herein, refers to a polymeric compound prepared by polymerizing monomers, whether of the same or a different type. The generic term polymer thus embraces the term homopolymer (employed to refer to polymers prepared from only one type of monomer, with the understanding that trace amounts of impurities can be incorporated into the polymer structure), and the term interpolymer as previously defined. Trace amounts of impurities, for example, catalyst residues, may be incorporated into and/or within the polymer.

The volume resistivity is tested according to a Dow method, which is based on ASTM D257. The measurement is made using a Keithley 6517 B electrometer, combined with the Keithley 8009 test fixture. The Keithley model 8009 test chamber is located inside the forced air oven and is capable of operating at elevated temperatures (the maximum temperature of the oven is 80° C.). The leakage current is directly read from the instrument and the following equation is used to calculate the volume resistivity:

$$\rho = \frac{V \times A}{I \times t}$$

where p is the volume resistivity (ohm.cm), V is applied voltage (volts), A is electrode contact area (cm$^2$), I is the leakage current (amps) and t is the average thickness of the sample. To get the average thickness of the samples, the thickness of each sample is measured before the tests, with five points of the sample measured to get an average thickness. The volume resistivity test is conducted at 1000 volts at 60° C. Two compression molded films are tested to get the average.

DETAILED DESCRIPTION

In an embodiment, the disclosure provides an encapsulant film comprising a composition, the composition comprising (A) a non-polar ethylene-based polymer having a density of 0.850 g/cc to 0.890 g/cc; (B) an organic peroxide; (C) a silane coupling agent; and (D) a co-agent comprising triallyl phosphate.

Composition

A composition comprising (A) a non-polar ethylene-based polymer having a density of 0.850 g/cc to 0.890 g/cc; (B) an organic peroxide; (C) a silane coupling agent; and (D) a co-agent comprising triallyl phosphate is used to form an encapsulant film.

(A) Non-Polar Ethylene-Based Polymer

The composition comprises a non-polar ethylene-based polymer.

In an embodiment, the non-polar ethylene-based polymer has a density from 0.850 g/cc, or 0.855 g/cc, or 0.860 g/cc, or 0.865 g/cc, or 0.870 g/cc to 0.875 g/cc, or 0.880 g/cc, or 0.885 g/cc, or 0.890 g/cc, or 0.900 g/cc.

In an embodiment, the non-polar ethylene-based polymer has a melting point from 40° C., or 45° C., or 50° C., or 55° C. to 60° C., or 65° C., or 70° C., or 80° C., or 90° C., or 95° C., or 100° C., or 110° C., or 120° C., or 125° C.

In an embodiment, the glass transition temperature (Tg) of the non-polar ethylene-based polymer is from −35° C., or −40° C., or −45° C. or −50° C. to −80° C., or −85° C., or −90° C., or −95° C., or −100° C.

In an embodiment, the melt index (MI) of the non-polar ethylene-based polymer is from 2 g/10 min, or 5 g/10 min, or 10 g/10 min, or 12 g/10 min to 30 g/10 min, or 35 g/10 min, or 40 g/10 min, or 45 g/10 min, or 50 g/10 min.

In an embodiment, the non-polar ethylene-based polymer is an ethylene/alpha-olefin interpolymer. Ethylene/alpha-olefin interpolymers can be random or block interpolymers.

Alpha-olefins are hydrocarbon molecules composed of hydrocarbon molecules comprising (i) only one ethylenic unsaturation, this unsaturation located between the first and second carbon atoms, and (ii) at least 3 carbon atoms, or of 3 to 20 carbon atoms, or in some cases of 4 to 10 carbon atoms and in other cases of 4 to 8 carbon atoms. Non-limiting examples of suitable α-olefins from which the copolymers are prepared include propylene, 1-butene, 1-pentene, 1-hexene, 1-octene, 1-dodecene, and mixtures of two or more of these monomers.

Non-limiting examples of suitable ethylene/alpha-olefin interpolymers include ethylene/propylene, ethylene/butene, ethylene/1-hexene, ethylene/1-octene, ethylene/propylene/1-octene, ethylene/propylene/butene, and ethylene/butene/1-octene interpolymers. In an embodiment, the ethylene/alpha-olefin interpolymer is a copolymer. Non-limiting examples of suitable ethylene/alpha-olefin copolymers include ethylene/propylene copolymers, ethylene/butene copolymers, ethylene/1-hexene copolymers, and ethylene/1-octene copolymers.

In an embodiment, the non-polar ethylene-based polymer is an ethylene/alpha-olefin interpolymer. The ethylene/alpha-olefin interpolymer has one, some, or all of the following properties:

(i) a density of 0.850 g/cc, or 0.855 g/cc, or 0.860 g/cc, or 0.865 g/cc, or 0.870 g/cc to 0.875 g/cc, or 0.880 g/cc, or 0.885 g/cc, or 0.890 g/cc, or 0.900 g/cc;

(ii) a melt index of 2 g/10 min, or 5 g/10 min, or 10 g/10 min, or 12 g/10 min to 30 g/10 min, or 35 g/10 min, or 40 g/10 min, or 45 g/10 min, or 50 g/10 min; and/or (iii) a melting point (Tm) of 40° C., or 45° C., or 50° C., or 55° C. to 60° C., or 65° C., or 70° C., or 80° C., or 90° C., or 95° C., or 100° C., or 110° C., or 120° C., or 125° C.

In an embodiment, the ethylene/alpha-olefin interpolymer has at least 2, or all 3 of properties (i)-(iii).

In an embodiment, the non-polar ethylene-based polymer is present in the composition in an amount of from 50 weight percent (wt %), or 80 wt %, or 95 wt % to 98.5 wt %, or 98.75 wt %, or 99.0 wt %, or 99.5 wt %, or less than 100 wt % based on the total weight of the composition.

Blends of non-polar ethylene-based polymers may also be used, and the non-polar ethylene-based polymers may be blended or diluted with one or more other polymers to the extent that the polymers are (i) miscible with one another, (ii) the other polymers have little, if any, impact on the desirable properties of the non-polar ethylene-based polymers, and (iii) the non-polar ethylene-based polymers(s) constitute from 70 wt %, or 75 wt %, or 80 wt %, or 85 wt %, or 90 wt % to 95 wt %, or 98 wt %, or 99 wt %, or less than 100 wt % of the blend.

Non-limiting examples of suitable commercially available non-polar ethylene-based polymers include ENGAGE resins from Dow Chemical, EXACT resins from EMCC, and LUCENE resins from LG Chemical.

(B) Organic Peroxide

The composition includes an organic peroxide. Non-limiting examples of suitable organic peroxides include dicumyl peroxide, lauryl peroxide, benzoyl peroxide, tertiary butyl perbenzoate, di(tertiary-butyl) peroxide, cumene hydroperoxide, 2,5-dimethyl-2,5-di(t-butyl-peroxy)hexyne-3, 2,-5-di-methyl-2,5-di(t-butyl-peroxy)hexane, tertiary butyl hydroperoxide, isopropyl percarbonate, alpha,alpha'-bis(tertiary-butylperoxy)diisopropylbenzene, t-butylperoxy-2-ethylhexyl-monocarbonate, 1,1-bis(t-butylperoxy)-3,5,5-trimethyl cyclohexane, 2,5-dimethyl-2,5-dihydroxyperoxide, t-butylcumylperoxide, alpha,alpha'-bis(t-butylperoxy)-p-diisopropyl benzene, and the like.

Non-limiting examples of suitable commercially available organic peroxides include TRIGONOX(R) from AkzoNobel and LUPEROX(R) from ARKEMA.

In an embodiment, the organic peroxide is present in the reaction composition in an amount of from 0.1 wt %, or 0.5 wt %, or 0.75 wt % to 1.5 wt %, or 2 wt %, or 3 wt %, or 5 wt % based on the total weight of the reaction composition.

(C) Silane Coupling Agent

The composition includes a silane coupling agent. In an embodiment, the silane coupling agent contains at least one alkoxy group. Non-limiting examples of suitable silane coupling agents include γ-chloropropyl trimethoxysilane, vinyl trimethoxysilane, vinyl triethoxysilane, vinyl-tris-(β-methoxy)silane, γ-methacryloxypropyl trimethoxysilane, β-(3,4-ethoxy-cyclohexyl)ethyl trimethoxysilane, γ-glycidoxypropyl trimethoxysilane, γ-mercaptopropyltrimethoxysilane, γ-aminopropyl trimethoxysilane, N-β-(aminoethyl)-γ-aminopropyl trimethoxysilane, and 3-(trimethoxysilyl)propylmethacrylate.

In an embodiment, the silane coupling agent is vinyl trimethoxysilane or 3-(trimethoxysilyl)propylmethacrylate.

In an embodiment, the silane coupling agent is present in an amount of from 0.01 wt %, or 0.05 wt %, or 0.1 wt %, or 0.2 wt % to 0.3 wt %, or 0.5 wt %, or 1 wt %, or 2 wt % based on the total weight of the reaction composition.

(D) Co-Agent

The composition comprises a co-agent comprising triallyl phosphate. Triallyl phosphate has the Structure I:

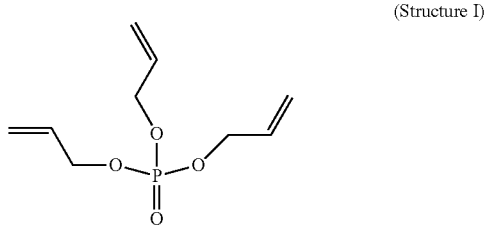

(Structure I)

In an embodiment, the co-agent is present in an amount from 0.01 wt %, or 0.05 wt %, or 0.1 wt %, or 0.15 wt %, or 0.2 wt % to 0.4 wt %, or 0.6 wt %, or 0.8 wt %, or 1.0 wt %, or 1.3 wt %, or 1.5 wt % based on the total weight of the composition.

In an embodiment, the co-agent is composed solely of triallyl phosphate. In such embodiment, the triallyl phosphate is present in an amount from 0.01 wt %, or 0.05 wt %, or 0.1 wt %, or 0.15 wt %, or 0.2 wt % to 0.4 wt %, or 0.6 wt %, or 0.8 wt %, or 1.0 wt %, or 1.3 wt %, or 1.5 wt % based on the total weight of the composition.

In an embodiment, the co-agent comprises a blend of triallyl phosphate and at least one other compound. Exemplary compounds which may be blended with triallyl phosphate include triallyl cyanurate (TAC) and triallyl isocyanurate (TAIC). In an embodiment, the co-agent comprises a blend of triallyl phosphate and at least one of (i) TAC and (ii) TAIC. In the blend, the triallyl phosphate constitutes from greater than 0 wt %, or 1 wt %, or 20 wt %, or 50 wt % to 99 wt %, or 99.5 wt %, or to less than 100 wt % of the blend. For example, in an embodiment in which the co-agent comprises a blend of triallyl phosphate and at least one of (i) TAC and (ii) TAIC, the triallyl phosphate constitutes from greater than 0 wt %, or 0.01 wt %, or 0.05 wt %, or 0.1 wt %, or 0.15 wt %, or 0.2 wt %, or 0.4 wt %, or 0.6 wt %, or 0.8 wt %, or 1 wt %, or 1.3 wt %, or 1.5 wt %, or 5 wt %, or 10 wt %, 15 wt %, or 20 wt %, or 50 wt % to 99 wt %, or 99.5 wt %, or less than 100 wt % based on the weight of the blend, and the at least one of (i) TAC and (ii) TAIC constitutes from greater than 0 wt %, or 0.5 wt %, or 1 wt % to 50 wt %, or 80 wt %, or 99 wt % based on the total weight of the blend.

(E) Optional Additives

In an embodiment, the composition includes one or more optional additives. Non-limiting examples of suitable additives include antioxidants, anti-blocking agents, stabilizing agents, colorants, ultra-violet (UV) absorbers or stabilizers, flame retardants, compatibilizers, fillers and processing aids.

The optional additives are present in an amount of from greater than zero, or 0.01 wt %, or 0.1 wt % to 1 wt %, or 2 wt %, or 3 wt % based on the total weight of the composition.

Encapsulant Films

The composition is formed into an encapsulant film. Compositions such as those described in any above embodiment or combination of two or more embodiments are used to form the encapsulant film.

In an embodiment, the composition forms the entirety of the encapsulant film.

The (A) non-polar ethylene-based polymer, (B) organic peroxide, (C) silane coupling agent, (D) co-agent and any optional additives can be added to and compounded with each other in any order or simultaneously. In an embodiment, the organic peroxide, silane coupling agent, co-agent and any optional additives are pre-mixed and the pre-mix is added to the non-polar ethylene-based polymer before or during compounding. In an embodiment, dry pellets of the non-polar ethylene-based polymer are soaked in the pre-mix and the soaked pellets are then compounded.

Non-limiting example of suitable compounding equipment include internal batch mixers (e.g., BANBURY and BOLLING internal mixer) and continuous single or twin screw mixers (e.g., FARREL continuous mixer, BRABENDER single screw mixer, WERNER and PFLEIDERER twin screw mixers and BUSS kneading continuous extruder). The type of mixer utilized, and the operating conditions of the mixer, can affect properties of the composition such as viscosity, volume resistivity, and extruded surface smoothness.

In an embodiment, it is desirable to avoid or limit crosslinking until lamination. Premature crosslinking and/or premature decomposition of the organic peroxide can result in the encapsulant film having decreased glass adhesion. In other words, the encapsulant film remains reactive until lamination, at which point crosslinking is completed and the encapsulant film composition of the encapsulant film becomes a reaction product comprising the non-polar ethylene-based polymer, the silane coupling agent, and the co-agent, with little if any residual organic peroxide. The compounding temperature of the composition is therefore less than the decomposition temperature of the organic peroxide. In an embodiment, the compounding temperature of the composition is from 80° C., or 90° C. to 100° C., or 110° C., or 120° C.

Encapsulant Film 1: In an embodiment, the encapsulant film is composed of a composition comprising (A) a non-polar ethylene-based polymer having a density of 0.850 g/cc to 0.890 g/cc, (B) an organic peroxide, (C) a silane coupling agent, and (D) a co-agent comprising triallyl phosphate.

Encapsulant Film 2: In an embodiment, the encapsulant film is composed of a composition comprising (A) from 50 wt %, or 80 wt %, or 95 wt % to 98.5 wt %, or 98.75 wt %, or 99 wt %, or 99.5 wt %, or less than 100 wt % of a non-polar ethylene-based polymer having a density of 0.850 g/cc to 0.890 g/cc, based on the total weight of the composition, (B) from 0.1 wt %, or 0.5 wt %, or 0.75 wt % to 1.5 wt %, or 2 wt %, or 3 wt %, or 5 wt % of an organic peroxide, based on the total weight of the composition, (C) from 0.01 wt %, or 0.05 wt %, or 0.1 wt %, or 0.2 wt % to 0.3 wt %, or 0.5 wt %, or 1 wt %, or 2 wt % of a silane coupling agent, based on the total weight of the composition, (D) from 0.01 wt %, or 0.1 wt %, or 0.2 wt % to 1.0 wt %, or 1.3 wt %, or 1.5 wt % of a co-agent, based on the total weight of the composition. It is understood that the aggregate amount of component (A), (B), (C), (D) and any optional additives yields 100 wt % of the composition.

Encapsulant Film 3: In an embodiment, the encapsulant film is composed of a composition comprising (A) from 95 wt % to 99 wt % of a non-polar ethylene-based polymer having a density of 0.850 g/cc to 0.890 g/cc, based on the total weight of the composition, (B) from 0.75 wt % to 1.5 wt % of an organic peroxide, based on the total weight of the composition, (C) from 0.1 wt %, to 0.3 wt % of a silane coupling agent, based on the total weight of the composition, (D) from 0.2 wt % to 1.3 wt % of a co-agent, based on the total weight of the composition. It is understood that the aggregate amount of component (A), (B), (C), (D) and any optional additives yields 100 wt % of the composition.

In an embodiment, the encapsulant film is according to Encapsulant Film 1, Encapsulant Film 2, or Encapsulant Film 3 having a volume resistivity of from greater than or equal to $2.0*10^{15}$ ohm.cm, or $2.1*10^{15}$ ohm.cm, or $2.2*10^{15}$ ohm.cm, or $2.5*10^{15}$ ohm.cm, or $3.0*10^{15}$ ohm.cm, or $4.0*10^{15}$ ohm.cm, or $5.0*10^{15}$ ohm.cm, or $6.0*10^{15}$ ohm.cm, or $7.0*10^{15}$ ohm.cm, or $8.0*10^{15}$ ohm.cm, or $9.0*10^{15}$ ohm.cm to $9.5*10^{15}$ ohm.cm, or $1.0*10^{16}$ ohm.cm, or $1.2*10^{16}$ ohm.cm, or $1.4*10^{16}$ ohm.cm, or $1.5*10^{16}$ ohm.cm at 60° C.

In an embodiment, the encapsulant film is according to Encapsulant Film 1, Encapsulant Film 2, or Encapsulant Film 3 having a volume resistivity of from greater than or equal to $2.1*10^{15}$ ohm.cm to $1.0*10^{16}$ ohm.cm at 60° C.

In an embodiment, the encapsulant film has a thickness of from 0.25 mm, or 0.275 mm, or 0.3 mm, or 0.325 mm, or 0.35 mm, or 0.375 mm, or 0.4 mm to 0.425 mm, or 0.45 mm, or 0.475 mm, or 0.5 mm, or 0.525 mm, or 0.55 mm.

In an embodiment, the encapsulant film is one layer, wherein the single layer is composed of the present composition. In an embodiment, the encapsulant film has two or more layers, wherein at least one layer is composed of the present composition.

Electronic Devices

The composition of this disclosure is used to construct an electronic device module, and particularly an encapsulant film used in the construction of an electronic device module. The encapsulant film is used as one or more "skins" for the electronic device, i.e., applied to one or both face surfaces of an electronic device, e.g., as a front encapsulant film or rear encapsulant film, or as both the front encapsulant film and the rear encapsulant film, e.g., in which the device is totally enclosed within the material.

In an embodiment, the electronic device module comprises (i) at least one electronic device, typically a plurality of such devices arrayed in a linear or planar pattern, (ii) at least one cover sheet, and (iii) at least one encapsulant film composed at least in part of a composition of the present disclosure. The encapsulant film is between the cover sheet and the electronic device, and the encapsulant film exhibits good adhesion to both the electronic device and the cover sheet.

In an embodiment, the electronic device module comprises (i) at least one electronic device, typically a plurality of such devices arrayed in a linear or planar pattern, (ii) a front cover sheet, (iii) a front encapsulant film, (iv) a rear encapsulant film, and (v) a backsheet, with at least one of the (iii) front encapsulant film and (iv) rear encapsulant film is composed at least in part of a composition of the present disclosure. The electronic device is sandwiched between the front encapsulant film and the rear encapsulant film with the cover sheet and backsheet enclosing the front encapsulant film/electronic device/rear encapsulant film unit.

In an embodiment, the cover sheet is glass, acrylic resin, polycarbonate, polyester or fluorine-containing resin. In a further embodiment, the cover sheet is glass.

In an embodiment, the back sheet is a single or multilayer film composed of glass, metal, or a polymeric resin. The back sheet is a film composed of glass or a polymeric resin. In a further embodiment, the back sheet is a multilayer film composed of a fluorine polymer layer and a polyethylene terephthalate layer.

In an embodiment, the electronic device is a solar cell or photovoltaic (PV) cell.

In an embodiment, the electronic device module is a PV module.

FIG. 1 illustrates an exemplary PV module. The rigid PV module 10 comprises photovoltaic cell 11 (PV cell 11) surrounded or encapsulated by the front encapsulant film 12a and rear encapsulant film 12b. The glass cover sheet 13 covers a front surface of the portion of the front encapsulant film 12a disposed over PV cell 11. The backsheet 14, e.g., a second glass cover sheet or polymeric substrate, supports a rear surface of the portion of the rear encapsulant film 12b disposed on a rear surface of PV cell 11. Backsheet 14 need not be transparent if the surface of the PV cell to which it is opposed is not reactive to sunlight. In this embodiment, the encapsulant films 12a and 12b fully encapsulate PV cell 11. In the embodiment shown in FIG. 1, the front encapsulant film 12a directly contacts the glass cover sheet 13 and the rear encapsulant film 12b directly contacts the backsheet 14. The PV cell 11 is sandwiched between the front encapsulant film 12a and rear encapsulant film 12b such that the front encapsulant film 12a and rear encapsulant film 12b are both in direct contact with the PV cell 11. The front encapsulant film 12a and rear encapsulant film 12b are also in direct contact with each other in locations where there is no PV cell 11.

The encapsulant film of the present disclosure can be the front encapsulant film, the rear encapsulant film, or both the front encapsulant film and rear encapsulant film. In an embodiment, the encapsulant film of the present disclosure is the front encapsulant film. In another embodiment, the encapsulant film is both the front encapsulant film and the rear encapsulant film.

In an embodiment, the encapsulant film(s) comprising the compositions of this disclosure are applied to an electronic device by one or more lamination techniques. Through lamination, the cover sheet is brought in direct contact with a first facial surface of the encapsulant film, and the electronic device is brought in direct contact with a second facial surface of the encapsulant film. The cover sheet is brought into direct contact with a first facial surface of the front encapsulant film, the back sheet is brought in direct contact with a second facial surface of the rear encapsulant film, and the electronic device(s) is secured between, and in direct contact with the second facial surface of the front encapsulant film and the first facial surface of the rear encapsulant film.

In an embodiment, the lamination temperature is sufficient to activate the organic peroxide and crosslink the composition, that is, the composition comprising the non-polar ethylene-based polymer, organic peroxide, silane coupling agent, and co-agent remains reactive until lamination when crosslinking occurs. During crosslinking, the silane coupling agent forms a chemical bond between two or more of the molecular chains of the non-polar ethylene-based polymer by way of a silane linkage. A "silane linkage" has the structure —Si—O—Si—. Each silane linkage may connect two or more, or three or more, molecular chains of the non-polar ethylene-based polymer. The silane coupling agent also interacts with the surface of the cover sheet to increase adhesion between the encapsulant film and the cover sheet. After lamination, the composition is a reaction product of the non-polar ethylene-based polymer, the organic peroxide, the silane coupling agent, and the co-agent.

In an embodiment, the lamination temperature for producing an electronic device is from 130° C., or 135° C., or 140° C., or 145° C. to 150° C., or 155° C., or 160° C. In an embodiment, the lamination time is from 8 minutes, or 10 minutes, or 12 minutes, or 15 minutes to 18 minutes, or 20 minutes, or 22 minutes, or 25 minutes.

In an embodiment, the electronic device of the present disclosure includes an encapsulant film composed of a composition which is the reaction product of (A) a non-polar ethylene-based polymer, (B) an organic peroxide, (C) a silane coupling agent, and (D) a co-agent comprising triallyl phosphate and the encapsulant film has an initial glass adhesion of greater than 120 N/cm, or 130 N/cm, or 140 N/cm, or 150 N/cm, or 160 N/cm, or 170 N/cm to 180 N/cm, or 190 N/cm, or 195 N/c, or 200 N/cm.

In an embodiment, the electronic device of the present disclosure includes an encapsulant film according to Encapsulant Film 1, Encapsulant Film 2, or Encapsulant Film 3 having one, some, or all of the following properties:
(i) an initial glass adhesion greater than 120 N/cm, or 130 N/cm, or 140 N/cm, or 150 N/cm, or 160 N/cm, or 170 N/cm to 180 N/cm, or 190 N/cm, or 195 N/cm, or 200 N/cm; and/or
(ii) a volume resistivity from greater than or equal to $2.0*10^{15}$ ohm.cm, or $2.1*10^{15}$ ohm.cm, or $2.2*10^{15}$ ohm.cm, or $2.5*10^{15}$ ohm.cm, or $3.0*10^{15}$ ohm.cm, or $4.0*10^{15}$ ohm.cm, or $5.0*10^{15}$ ohm.cm, or $6.0*10^{15}$ ohm.cm, or $7.0*10^{15}$ ohm.cm, or $8.0*10^{15}$ ohm.cm, or $9.0*10^{15}$ ohm.cm to $9.5*10^{15}$ ohm.cm, or $1.0*10^{16}$ ohm.cm, or $1.2*10^{16}$ ohm.cm, or $1.4*10^{16}$ ohm.cm, or $1.5*10^{16}$ ohm.cm at 60° C.

In an embodiment, the electronic device of the present disclosure includes an encapsulant film according to Encapsulant Film 1, Encapsulant Film 2, or Encapsulant Film 3 having both of the properties (i) and (ii).

In an embodiment, the electronic device of the present disclosure includes an encapsulant film according to Encapsulant Film 1, Encapsulant Film 2, or Encapsulant Film 3 having one, some, or all of the following properties:
(i) an initial glass adhesion of greater than 140 N/cm to 190 N/cm; and/or
(ii) a volume resistivity of from greater than or equal to $2.1*10^{15}$ ohm.cm to $1.0*10^{16}$ ohm.cm at 60° C.

In an embodiment, the electronic device of the present disclosure includes an encapsulant film according to Encapsulant Film 1, Encapsulant Film 2, or Encapsulant Film 3 having both of the properties (i) and (ii).

Some embodiments of the present disclosure will now be described in detail in the following examples.

EXAMPLES

Materials

EVA: an ethylene/vinyl acetate copolymer having a density of 0.955 g/cc (measured according to ASTM D792), a melt index (MI) of 6.0 g/10 min (measured according to ASTM D1238, at 190°, 2.16 kg), and a vinyl acetate content of 28 wt % based on the total weight of the copolymer, available as Elvax 260 from DuPont.

POE: ethylene/octene copolymer (non-polar, ethylene-based polymer) having a density of 0.880 g/cc and a MI of 18.0 g/10 min Peroxide: tert-butylperoxy 2-ethylhexyl carbonate (organic peroxide available from Arkema)

VMMS: 3-(trimethoxysilyl)propylmethacrylate (silane coupling agent available from Dow Corning)

TAIC: triallyl isocyanurate (cross linking co-agent available from Fangruida Chemicals Co., Ltd.)

TAP: triallyl phosphate (cross linking co-agent available from TCI Chemical Industry Co., Ltd.)

Sample Preparation

Compositions are prepared according to Table 1, below, by first pre-mixing the organic peroxide, silane coupling agent and co-agent(s) at the desired percentages set forth in Table 1 in a glass jar. Dry polymer pellets of EVA or POE, depending on the example (see Table 1), are put in the jar. To ensure a homogenous distribution and complete soaking of the curing package (i.e., organic peroxide, silane coupling agent and co-agent(s)) into the pellets, the jar is placed into a 40° C. oven and periodically agitated every 15 minutes.

The compositions are compression molded into 0.5 mm films. Compression molding is performed using a hydraulic press. The compositions are pre-heated at 120° C. under no applied pressure for 5 minutes, followed by 2 stages of applied pressure. Stage 1 is 5 MPa of pressure for 0.5 minutes. Stage 2 is 10 MPa of pressure for 0.5 minutes. Subsequently, the temperature is increased to 150° C. and held for 15 minutes at 10 MPa pressure. Finally, the temperature is cooled to room temperature and the pressure is released.

For volume resistivity testing, each compression molded film is cut into four replicates for testing.

TABLE 1

| Component | CE1 | CE2 | CE3 | CE4 | CE5 | CE6 | CE7 | IE1 | IE2 | IE3 |
|---|---|---|---|---|---|---|---|---|---|---|
| EVA (wt %) | 100 | 98.75 | 98.25 | 98.25 | | | | | | |
| POE (wt %) | | | | | 100 | 98.75 | 98.25 | 98.25 | 97.75 | 98.25 |
| Peroxide (wt %) | | 1 | 1 | 1 | | 1 | 1 | 1 | 1 | 1 |
| VMMS (wt %) | | 0.25 | 0.25 | 0.25 | | 0.25 | 0.25 | 0.25 | 0.25 | 0.25 |
| TAIC (wt %) | | | 0.5 | | | | 0.5 | | | 0.25 |
| TAP (wt %) | | | | 0.5 | | | | 0.5 | 1 | 0.25 |
| Total (wt %) | 100 | 100 | 100 | 100 | 100 | 100 | 100 | 100 | 100 | 100 |
| MH (dNm) | | 5.61 | 7.42 | 7.00 | | 1.67 | 3.25 | 3.01 | 3.35 | 3.31 |
| t90 (min) | | 8.62 | 7.69 | 7.84 | | 14.22 | 11.03 | 11.22 | 11.17 | 10.78 |
| Initial Glass Adhesion (N/cm) | | 109 | 113 | 117 | | | 135 | 167 | 129 | 169 |

TABLE 1-continued

| Component | CE1 | CE2 | CE3 | CE4 | CE5 | CE6 | CE7 | IE1 | IE2 | IE3 |
|---|---|---|---|---|---|---|---|---|---|---|
| VR @ 60° C. (ohm · cm) | $2.8 * 10^{13}$ | $7.4 * 10^{12}$ | $1.4 * 10^{13}$ | $3.4 * 10^{14}$ | $4.7 * 10^{14}$ | $6.0 * 10^{14}$ | $2.0 * 10^{15}$ | $4.9 * 10^{15}$ | $9.5 * 10^{15}$ | $2.2 * 10^{15}$ |

CE = comparative example
IE = inventive example

CE1-4 are based on EVA films. These comparative examples show that some improvement in VR is seen in EVA-based compositions when using either TAIC (CE3) or TAP (CE4) as a co-agent in EVA-based films, but the initial glass adhesion remains low (113 N/cm and 117 N/cm for CE3 and CE4, respectively).

CE5-7 and IE1-3 use non-polar ethylene-based polymer films. A comparison of IE1-3 to CE5-6 shows that the inclusion of TAP in the non-polar ethylene-based polymer films results in an improvement in VR. Specifically, the examples show an approximately 4.7-20×increase in VR when curing with TAP compared to the base resin alone (CE5). IE1-IE3 have volume resistivities of $4.9*10^{15}$ ohm.cm, $9.5*10^{15}$ ohm.cm and $2.2*10^{15}$ ohm.cm at 60° C., respectively, while CE5 (non-polar ethylene-based polymer alone) has a volume resistivity of $4.7*10^{14}$ ohm.cm at 60° C.

A comparison of IE1 and IE3 to CE7 (non-polar ethylene-based polymer with TAIC) also shows that in addition to an improvement in VR compared to the base resin alone, the use of TAP as co-agent results in improved initial glass adhesion while maintaining the improved VR. Specifically, IE1 has a VR of $4.9*10^{15}$ and an initial glass adhesion of 167 N/cm while CE7 has a VR of $2.0*10^{15}$ and an initial glass adhesion of 135 N/cm.

It is specifically intended that the present disclosure not be limited to the embodiments and illustrations contained herein, but include modified forms of those embodiments including portions of the embodiments and combinations of elements of different embodiments as come within the scope of the following claims.

The invention claimed is:

1. An electronic device module comprising:
an electronic device having a front surface and an opposing rear surface, and
a front encapsulant film and a rear encapsulant film, each encapsulant film consisting of a crosslinked polymeric composition which is the reaction product of a composition consisting of
(A) from 97.75 wt % to 98.25 wt % of a polymeric component consisting of one or more linear non-polar ethylene-based polymers, each linear non-polar ethylene-based polymer consisting of (i) ethylene and (ii) a linear $C_4$-$C_8$ α-olefin, each of the ethylene-based polymers having a density of 0.850 g/cc to 0.890 g/cc
(B) from 0.75 wt % to 1.5 wt % of an organic peroxide;
(C) from 0.1 wt % to 0.3 wt % of a silane coupling agent; and
(D) from 0.25 wt % to 1.0 wt % of a co-agent consisting of triallyl phosphate and optionally at least one of triallyl cyanurate and triallyl isocyanurate;
the electronic device is sandwiched between the front encapsulant film and the rear encapsulant film, the front encapsulant film is in direct contact with the front surface of the electronic device and the rear encapsulant film is in direct contact with the opposing rear surface of the electronic device and the electronic device is totally enclosed within the front encapsulant film and the rear encapsulant film, at least one film has a volume resistivity from greater than or equal to $2.2*10^{15}$ ohm.cm to $9.5*10^{15}$ ohm.cm at 60° C.;
a cover sheet in direct contact with the front encapsulant film and the front encapsulant film has an initial glass adhesion greater than 120 N/cm to 200 N/cm; and
a backsheet consisting of a material selected from the group consisting of glass, metal, fluorine polymer, polyethylene terephthalate, and combinations thereof, the rear encapsulant film sandwiched between, and in direct contact with, (i) the electronic device and (ii) with the backsheet.

2. The electronic device module of claim 1, wherein the linear non-polar ethylene-based polymer is selected from the group consisting of an ethylene/$C_4$-$C_8$ α-olefin random copolymer and an ethylene/$C_4$-$C_8$ α-olefin block copolymer.

3. The electronic device module of claim 1 wherein the silane coupling agent is 3-(trimethoxysilyl)propylmethacrylate.

4. The electronic device module of claim 1, wherein the co-agent comprises from greater than 20 wt % to less than 100 wt % of triallyl phosphate based on the total weight of the co-agent.

5. The electronic device module of claim 4, wherein the co-agent consists of a mixture of triallyl phosphate and at least one of (i) triallyl cyanurate and triallyl isocyanurate.

6. The electronic device module of claim 5, wherein the co-agent consists of from 50 wt % to less than 100 wt % triallyl phosphate based on the total weight of the co-agent.

7. The electronic device module of claim 1, wherein the electronic device is a photovoltaic cell.

8. The electronic device module of claim 7 wherein the backsheet consists of glass.

9. The electronic device module of claim 7 wherein the backsheet consists of metal.

10. The electronic device module of claim 7 wherein the backsheet is a multilayer film consisting of a fluorine polymer layer and a polyethylene terephthalate layer.

11. The electronic device module of claim 1 wherein a portion of the front encapsulant film directly contacts a portion of the rear encapsulant film.

12. The electronic device module of claim 11 wherein the backsheet directly contacts the rear encapsulant film.

13. An electronic device module comprising:
an electronic device that is a photovoltaic cell having a front surface and an opposing rear surface, and
a front encapsulant film and a rear encapsulant film, each encapsulant film consisting of a crosslinked polymeric composition which is the reaction product of a composition consisting of
(A) from 97.75 wt % to 98.25 wt % of a polymeric component consisting of one or more linear non-polar ethylene-based polymers, each linear non-polar ethylene-based polymer consisting of (i) ethylene and (ii) a linear $C_4$-$C_8$ α-olefin, each of the ethylene-based polymers having a density of 0.850 g/cc to 0.890 g/cc;
(B) from 0.75 wt % to 1.5 wt % of an organic peroxide;
(C) from 0.1 wt % to 0.3 wt % of a silane coupling agent; and (D) from 0.25 wt % to 1.0 wt % of a co-agent consisting of triallyl phosphate and optionally at least one of triallyl cyanurate and triallyl isocyanurate;

the electronic device sandwiched between the front encapsulant film and the rear encapsulant film such that the electronic device is in direct contact with only the front encapsulant film and the rear encapsulant film, at least one film has a volume resistivity from greater than or equal to $2.2*10^{15}$ ohm.cm to $9.5*10^{15}$ ohm.cm at 60° C.;

a glass cover sheet in direct contact with a front surface of the front encapsulant film; and a backsheet in direct contact with a rear surface of the rear encapsulant film.

* * * * *